United States Patent
Uematsu

(10) Patent No.: US 12,043,918 B2
(45) Date of Patent: Jul. 23, 2024

(54) SILICON CARBIDE CRYSTAL MANUFACTURING APPARATUS, CONTROL DEVICE OF SILICON CARBIDE CRYSTAL MANUFACTURING APPARATUS, AND METHOD OF GENERATING LEARNING MODEL AND CONTROLLING SILICON CARBIDE CRYSTAL MANUFACTURING APPARATUS

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Daisuke Uematsu, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 34 days.

(21) Appl. No.: 17/881,255

(22) Filed: Aug. 4, 2022

(65) Prior Publication Data
US 2023/0044970 A1    Feb. 9, 2023

(30) Foreign Application Priority Data

Aug. 6, 2021 (JP) .................................. 2021-130254
Jul. 27, 2022 (JP) .................................. 2022-119887

(51) Int. Cl.
C30B 25/16    (2006.01)
C30B 29/36    (2006.01)
(Continued)

(52) U.S. Cl.
CPC .............. C30B 25/16 (2013.01); C30B 29/36 (2013.01); G05B 13/0265 (2013.01);
(Continued)

(58) Field of Classification Search
CPC ...... C30B 25/16; C30B 29/36; G05B 13/0265
See application file for complete search history.

(56) References Cited

U.S. PATENT DOCUMENTS 7,272,322 B2 *  9/2007  Tegge, Jr. .......... H04B 10/1125
                                                          398/131
9,725,823 B2 *  8/2017  Sasaki ..................... C30B 29/36
(Continued)

FOREIGN PATENT DOCUMENTS

JP      2018-169818 A    11/2018

*Primary Examiner* — Ramesh B Patel
(74) *Attorney, Agent, or Firm* — Posz Law Group, PLC

(57) ABSTRACT

A control device has a learning model that outputs an estimated value of a second physical quantity that is unobservable under a condition of manufacturing a SiC crystal, from a first physical quantity that is observable under the condition of manufacturing the SiC crystal. The control device generates a basic learning model by mechanical learning using, as teacher data, a simulation result of a simulation model based on structural data of a SiC crystal manufacturing apparatus. The control device acquires measured values of the first physical quantity and the second physical quantity measured under a condition that the SiC crystal is unable to be manufactured while the second physical quantity is observable, and generates the learning model that corrects an output of the basic learning model based on the measured values.

6 Claims, 5 Drawing Sheets

(51) Int. Cl.
    *G05B 13/02*     (2006.01)
    *C30B 23/00*     (2006.01)
    *C30B 23/02*     (2006.01)

(52) U.S. Cl.
    CPC .............. *C30B 23/00* (2013.01); *C30B 23/02* (2013.01); *C30B 23/025* (2013.01)

(56) References Cited

U.S. PATENT DOCUMENTS

| | | | | |
|---|---|---|---|---|
| 11,543,653 | B2* | 1/2023 | Fan | G02B 1/002 |
| 11,556,853 | B2* | 1/2023 | Kataoka | H01J 37/32935 |
| 11,592,800 | B2* | 2/2023 | Yoshida | B23Q 17/0957 |
| 2020/0342357 | A1* | 10/2020 | Kataoka | G01J 3/443 |
| 2022/0034829 | A1* | 2/2022 | Yokoyama | C30B 19/04 |
| 2023/0221700 | A1* | 7/2023 | Yamaguchi | H01L 21/324 |
| | | | | 700/121 |

* cited by examiner

SILICON CARBIDE CRYSTAL MANUFACTURING APPARATUS, CONTROL DEVICE OF SILICON CARBIDE CRYSTAL MANUFACTURING APPARATUS, AND METHOD OF GENERATING LEARNING MODEL AND CONTROLLING SILICON CARBIDE CRYSTAL MANUFACTURING APPARATUS

CROSS REFERENCE TO RELATED APPLICATIONS

The present application claims the benefit of priority from Japanese Patent Application No. 2021-130254 filed on Aug. 6, 2021 and Japanese Patent Application No. 2022-119887 filed on Jul. 27, 2022. The entire disclosures of all of the above applications are incorporated herein by reference.

TECHNICAL FIELD

The present disclosure relates to a silicon carbide (SiC) crystal manufacturing apparatus, a control device of a SiC crystal manufacturing apparatus, and a method of generating a learning model and controlling a SiC crystal manufacturing apparatus.

BACKGROUND

When manufacturing a SiC crystal, an inside of a chamber where the SiC crystal grows (especially, a crystal growth surface) needs to be heated to a very high temperature (2000° C. or higher on the crystal growth surface), and an inner wall of the chamber needs to be covered with a non-transparent heat insulating material. In addition, due to positional interference with a path for supplying raw materials to the crystal growth surface, it is not possible to install sensors on the crystal growth surface and the like in the chamber to measure a state at the time of manufacturing the SiC crystal.

SUMMARY

The present disclosure provides a control device having a learning model that outputs an estimated value of a second physical quantity that is unobservable under a condition of manufacturing a SiC crystal, from a first physical quantity that is observable under the condition of manufacturing the SiC crystal. The control device generates a basic learning model by mechanical learning using, as teacher data, a simulation result of a simulation model based on structural data of a SiC crystal manufacturing apparatus. The control device acquires measured values of the first physical quantity and the second physical quantity measured under a condition that the SiC crystal is unable to be manufactured while the second physical quantity is observable, and generates the learning model that corrects an output of the basic learning model based on the measured values. The present disclosure also provides a SiC crystal manufacturing apparatus including the control device, and a method of generating the learning model and controlling the SiC crystal manufacturing apparatus using the learning model.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
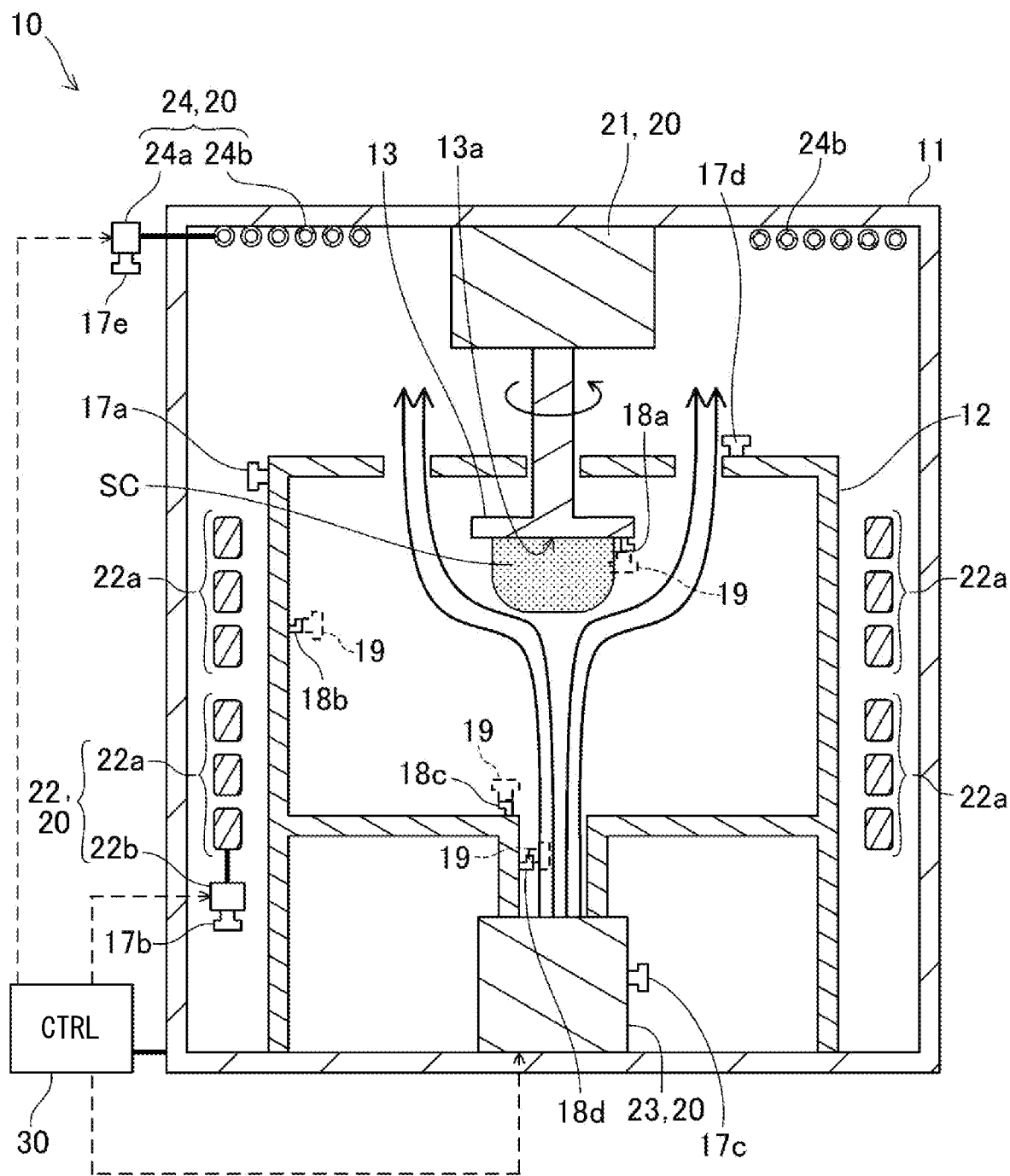
FIG. 1 is a cross-sectional view of a SiC crystal manufacturing apparatus according to a first embodiment of the present disclosure.

Next, a relevant technology is described only for understanding the following embodiments. A first technique in the relevant technology generates a prediction model by machine learning using only a simulation result based on a theoretical formula as teacher data and setting only a manual instruction signal as an input value, and displays an image of a theoretically predicted state in a chamber using the prediction model. In the first technique, a first state output from a semiconductor crystal manufacturing apparatus is input to the prediction model that is machine-learned. The image generated based on a second state output from the prediction model is displayed outside the manufacturing apparatus. The first state is a physical quantity that can be directly measured by a sensor or the like among internal states of the manufacturing apparatus. The first state includes, for example, positions of parts of the manufacturing apparatus, temperatures or pressures at measurement points, and the like. The second state is a physical quantity that is extremely difficult to directly measure with a sensor or the like among the internal states of the manufacturing apparatus. The second state includes, for example, a temperature, a raw material concentration, a flow velocity and a vector indicating a flow direction at each point in a specific region inside the manufacturing apparatus. An operator of the manufacturing apparatus can grasp the second state inside the manufacturing apparatus by watching the image.

According to the first technique, the prediction model is obtained by machine learning. The results of simulations of multiple states of the manufacturing apparatus using an analytical simulation model are used as the teacher data. The simulation model is generated from a three-dimensional model generated from CAD data of the manufacturing apparatus, physical property data of materials used for a reaction, and the like.

In a second technique in the relevant technology, data of various sensors of a plasma processing apparatus is used as teacher data for machine learning.

According to the first technique, the teacher data for generating the prediction model is obtained by the simulation. However, the simulation may not reflect exact characteristics of the actual semiconductor crystal manufacturing apparatus, or may not reflect changes over time of the semiconductor crystal manufacturing apparatus. That is, there is a possibility that the prediction accuracy of the actual state in a furnace is not sufficient in the prediction model generated based on the teacher data by the simulation. On the other hand, in the second technique, sensor data is used as teacher data. Although a large amount of teacher data is required to generate a highly accurate learning model, an economical cost and a temporal cost increase to obtain the large amount of teacher data through experiments.

Further, among semiconductor crystals, a high temperature environment of 2000° C. or higher is required to manufacture SiC crystals in particular. Therefore, it is necessary to cover a heated part, such as an internal space of the chamber, with a non-transparent heat insulating material, and it is impossible to measure a temperature of a crystal growth site, such as around a susceptor, which is the most important for crystal growth, with a pyrometer or the like. Also, if a sensor is installed to measure the temperature of the crystal growth site, a raw material supply path and the sensor interfere with each other during the actual crystal growth process. For this reason as well, it is difficult to directly observe the state inside the chamber during the actual crystal growth process.

Simulations using methods such as finite element method (FEM) may be used to estimate sites that are unobservable directly. However, since simulations generally require a calculation time of several tens of hours or more, even if a simulation is performed using measured values (temperature, flow velocity, pressure, and the like) of a chamber state that change from moment to moment as input values, it takes longer time to obtain the simulation results than the time scale (order of about 100 milliseconds to 1 second) required for feedback control to crystal growth. Therefore, it is difficult to estimate by simulation during the growth process.

Furthermore, physical property values used in the simulation are values under predetermined ideal conditions such as values described in literatures, and do not accurately reflect members and states in the manufacturing apparatus during the actual growth process, including changes over time. Machine learning obtained from simulation data as teacher data cannot realize sufficiently accurate estimation for the actual growth process. It is necessary to fine-tune the machine learning model obtained by using the simulation data as teacher data using measured data obtained by the manufacturing apparatus used for actual crystal growth.

The present disclosure proposes a new technique for manufacturing SiC crystals, which has never existed before. Specifically, the present disclosure provides a method of generating a learning model that can accurately predict a physical quantity that is unobservable at the time of crystal manufacturing, a SiC crystal manufacturing apparatus that can manufacture a high-quality SiC crystal using such a learning model, and a control device of a SiC crystal manufacturing apparatus. In the present disclosure, a model obtained by machine learning is referred to as "learning model".

One aspect of the present disclosure provides a SiC crystal manufacturing apparatus. The SiC crystal manufacturing apparatus includes a chamber, an actuator, a first sensor, and a control device. In the chamber, a SiC crystal is manufactured from raw materials (for example, silicon-containing gas and carbon-containing gas). The chamber may be referred to as a reactor. The actuator controls a temperature in the chamber, a flow amount, a flow rate, and a concentration of the raw materials, and the like. The first sensor measures a first physical quantity that is observable inside or outside the chamber under a condition of manufacturing the SiC crystal.

The control device has a learning model that outputs an estimated value of a second physical quantity that is unobservable under the condition of manufacturing the SiC crystal from the measured value of the first sensor. The control device feedback-controls the actuator so that the difference between the estimated value output by the learning model and the target value of the second physical quantity becomes small when manufacturing the SiC crystal.

The control device includes a basic model generation module, an experimental result acquisition module, a correlation data acquisition module, a correlation determination module, and a model correction module. The basic model generation module generates a basic learning model by machine learning using, as teacher data, multiple simulation results (first simulation results) of a set of the first physical quantity and the second physical quantity generated using a simulation model based on structural data of the SiC crystal manufacturing apparatus. The experimental result acquisition module acquires multiple experimental results of a set of a measured value of the first sensor (first sensor measured value) and a measured value of the second sensor (second sensor measured value) in the SiC crystal manufacturing apparatus attached with the first sensor and the second sensor that measures the second physical quantity when the actuator is driven under a condition that the SiC crystal is unable to be manufactured while the second physical quantity is observable. The correlation data acquisition module acquires a simulation result of the second physical quantity (second simulation result) output from the simulation model when the first physical quantity matches the first sensor measured value. The correlation determination module determines a correlation between the second simulation result and the second sensor measured value. The model correction module generates the learning model that outputs a result of correcting an output of the basic learning model with the above-described correlation as the estimated value of the second physical quantity.

The present disclosure also provides a method of generating a learning model for obtaining an estimated value of an unobservable second physical quantity from an observable first physical quantity when manufacturing a SiC crystal with a SiC crystal manufacturing apparatus. The method includes generating a basic model generation process, an experimental result acquisition process, a correlation data acquisition process, a correlation determination process, and a model correction process.

The basic model generation process includes generating a basic learning model by machine learning using, as teacher data, multiple simulation results (first simulation results) of a set of a first physical quantity and a second physical quantity generated using a simulation model based on structural data of the SiC crystal manufacturing apparatus. The experimental result acquisition process includes acquiring multiple experimental results of a set of a measured value of the first sensor (first sensor measured value) and a measured value of the second sensor (second sensor measured value) when the actuator is driven under a condition that the SiC crystal cannot be manufactured but the second physical quantity is observable in the SiC crystal manufacturing apparatus attached with the first sensor and the second sensor that measures the second physical quantity.

The correlation data acquisition process includes acquiring a simulation result of the second physical quantity (second simulation result) when the first physical quantity matches the first sensor measured value by using the simulation model. The correlation determination process includes determining a correlation between the second simulation result and the second sensor measured value. The model correction process includes generating a learning model that outputs a result of correcting an output of the basic learning model with the above-described correlation as an estimated value of the second physical quantity.

The techniques disclosed in the present disclosure can provide feedback control of the SiC crystal manufacturing apparatus using the learning model capable of accurately predicting the second physical quantity. Since the learning model by machine learning does not require complicated calculation, it takes only a few milliseconds to 1 second to obtain an output, that is, the estimated value of the second physical quantity, from an input. Therefore, the learning model can be used for real-time feedback control.

In particular, the techniques disclosed in the present disclosure also use the first sensor, which is used in manufacture of the SiC crystal, in the experiment to obtain the first and second measured values to correct the output of the basic learning model. Therefore, by correcting the learning model used at the time of manufacturing the SiC crystal with the correlation obtained from the experimental results, a highly accurate estimated value of the second physical quantity can be obtained. Further, the control device using the learning model controls the actuator of the SiC crystal manufacturing apparatus so that the difference between the target value and the estimated value of the second physical quantity becomes small. The control device operates as if feeding back the second physical quantity.

The control device can bring the second physical quantity, which is unobservable when manufacturing the SiC crystal, close to the target value. Examples of the second physical quantity is a surface temperature of a susceptor. The surface temperature of the susceptor is an important factor affecting the quality of SiC crystals. If the surface temperature of the susceptor can be brought close to the target value, good quality SiC crystals can be obtained. The susceptor is a support plate that supports a substrate when the crystal is grown.

Details and further improvements to the techniques disclosed herein will be described below.

First Embodiment

A SiC crystal manufacturing apparatus 10 according to a first embodiment of the present disclosure will be described with reference to the drawings. The SiC crystal manufacturing apparatus 10 is an apparatus for manufacturing a SiC single crystal. FIG. 1 shows a cross-sectional view of the SiC crystal manufacturing apparatus 10.

The SiC crystal manufacturing apparatus 10 includes a chamber 12, a heater 22, a susceptor 13, a rotating device 21, and a gas supply device 23. These parts are housed in a housing 11. The chamber 12 is a reaction furnace in which a high-temperature raw material gas is reacted to grow the SiC single crystal. Since SiC grows at a high temperature of 2000° C. or higher, an inner wall of the chamber 12 is covered with a non-transparent heat insulating material, although not shown. Alternatively, the chamber 12 is made of non-transparent insulation material.

The gas supply device 23 generates a first raw material gas containing silicon and a second raw material gas containing carbon, and supplies these raw material gases to the chamber 12 through a hole provided at a bottom of the chamber 12. The first raw material gas and the second raw material gas are collectively referred to as a raw material gas. The gas supply device 23 heats the raw material gas to a predetermined preparation temperature.

The heater 22 for heating the raw material gas in the furnace is provided on an outer periphery of the chamber 12. The heater 22 includes a high frequency coil 22a and a high frequency generator 22b. The heater 22 heats the raw material gas inside the chamber 12 to 2000° C. or higher.

The raw material gas heated to a high temperature of 2000° C. or higher crystallizes on a surface 13a of the susceptor 13. The susceptor 13 is a support plate that supports a substrate for growing a SiC crystal. The surface 13a of the susceptor 13 corresponds to a crystal growth surface. The susceptor 13 is supported by the rotating device 21. The rotating device 21 rotates the susceptor 13. The rotating device 21 can also move the susceptor 13 in a vertical direction.

A cooler 24 is provided above the chamber 12. The cooler 24 has a circulator 24a configured to circulate a refrigerant and a cooling pipe 24b through which the refrigerant flows. The cooler 24 cools the residual gas of the raw material gas discharged from the chamber 12.

The gas supply device 23, the heater 22, the rotating device 21, and the cooler 24 are controlled by a control device (CTRL) 30. The gas supply device 23, the heater 22, the rotating device 21, and the cooler 24 are actuators for operating the SiC crystal manufacturing apparatus 10, and are collectively referred to as actuators 20 below for convenience. The actuators 20 control manufacturing conditions exemplified below. Examples of the manufacturing conditions include a temperature and a pressure in the chamber 12, a flow rate, a flow velocity, a gas concentration, a gas temperature, a gas pressure, and a gas inflow position of the raw material gas supplied from the gas supply device 23, a current value, a control voltage, and a frequency of electric current that flows through the high frequency coil 22a, a vertical position and a moving speed of the high frequency coil 22a, a vertical position, a moving speed and a rotation speed of the susceptor 13, a chamber outer wall temperature, the amount of refrigerant, a refrigerant temperature, a refrigerant pressure, and a pressure, a flow rate, and a temperature of exhaust gas.

The thick arrow lines in FIG. 1 show the flow of the reaction gas when the SiC crystal is grown. As described above, the raw material gas that reach the surface 13a of the susceptor 13 has a high temperature of 2000° C. or higher.

The SiC crystal manufacturing apparatus 10 further includes multiple sensors 17a-17e. The sensor 17a measures the temperature of the outer wall of the chamber 12. The sensor 17b measures the temperature of the heater 22 (or the electric current that flows through the high frequency coil 22a). The sensor 17c measures the temperature, the pressure, the flow rate, the flow velocity, the concentration of the raw material gas supplied to the chamber 12. The sensor 17d measures the temperature, the pressure, the flow rate, the flow velocity, and the concentration of the residual gas discharged from the chamber 12. The sensor 17e measures the temperature of the cooler 24. These sensors 17a-17e are sensors for knowing the state of the chamber 12 and the state of the raw material gas when manufacturing the SiC crystal. Hereinafter, these sensors 17a-17e are collectively referred to as first sensors 17. The first sensors 17 function when manufacturing the SiC crystal. That is, the physical quantities (the temperature, the flow velocity, and the like) measured by the first sensors 17 correspond to first physical quantities that are observable under conditions of manufacturing the SiC crystal. Each of the first sensors 17 is arranged at a position where the temperature is lower than a heat resistant temperature of sensors even under the conditions of manufacturing the SiC crystal. The first sensors 17 also include sensors that measure outputs of the actuators 20. When the actuators 20 operate so as to follow target values, the target values are approximate values of the outputs of the actuators 20, so that the target values may be regarded as pseudo measured values of the first sensors 17. The SiC crystal manufacturing apparatus 10 has a large number of other first sensors, but their illustrations are omitted.

The measured values of the first sensors 17 are sent to the control device 30. The control device 30 controls the actuators 20, such as the rotating device 21, the heater 22, the gas supply device 23, and the cooler 24, based on the measured values of the first sensors 17. The control device 30 determines the target value of each of the actuators 20, and controls each of the actuators 20 so that the output of each of the actuators 20 follows the target value. For example, the target value and the output of the rotating device 21 are the rotation speed of the susceptor 13, and the control device 30 controls the rotating device 21 so that the actual rotation speed of the rotating device 21 follows the target rotation speed. The target values of the gas supply device 23 are the temperature, the pressure, the flow velocity, the flow rate, and the concentration of the raw material gas, and the control device 30 controls the gas supply device 23 to that the temperature, the pressure, the flow velocity, the flow rate, and the concentration of the raw material gas generated by the gas supply device 23 follow the target temperature, the target pressure, the target flow velocity, the target flow rate, and the target concentration.

When the control device 30 controls the actuators 20, a single crystal SC of SiC grows on the surface 13a of the susceptor 13. That is, the SiC crystal is manufactured by the SiC crystal manufacturing apparatus 10. The temperature and the pressure inside the chamber 12, especially the temperature of the surface 13a (crystal growth surface) of the susceptor 13, are important for manufacturing good quality crystals. In particular, the temperature at the center of the surface 13a of the susceptor 13 is important. In other words, if the temperature and the pressure of various parts inside the chamber 12 and the temperature of the surface 13a of the susceptor 13 (the temperature at the center of the surface) can be matched with the target values, a good quality single crystal can be obtained. For convenience, in the following, the temperature of the surface 13a of the susceptor 13 (for example, the temperature at the center of the surface 13a) is simply referred to as the surface temperature.

However, the internal temperature (particularly, the surface temperature) of the chamber 12 under the conditions of manufacturing the SiC crystal exceeds 2000° C. When manufacturing the SiC crystal, the temperature inside the chamber 12 exceeds the heat resistant temperature of sensors, so that sensors cannot be arranged inside the chamber 12. Alternatively, if a sensor is placed in the flow path of the raw material gas, the flow of the raw material gas is obstructed, so that the sensor cannot be placed in the flow path of the raw material gas. However, it is possible to operate the SiC crystal manufacturing apparatus 10 so that the temperature inside the chamber 12 is lower than the heat resistant temperature of sensors although the SiC crystal is unable to be manufactured. When the SiC crystal manufacturing apparatus 10 is operated so that the temperature inside the chamber 12 is lower than the heat resistant temperature of sensors, it is possible to measure the temperature and the pressure (particularly the surface temperature) inside the chamber 12. Physical quantities that are unobservable under the conditions of manufacturing the SiC crystal, such as the temperature and the pressure inside the chamber 12, the flow rate and the flow velocity of the raw material gas on the surface of the susceptor, are referred to as second physical quantities. The second physical quantities are observable when the actuators 20 are operated so that the temperature inside the chamber 12 is lower than the heat resistant temperature of sensors although the SiC crystal is unable to be manufactured. The second physical quantities are deeply related to the quality of the SiC crystal to be manufactured. If the second physical quantities can be made to follow the target values, a high-quality SiC crystal can be manufactured.

As will be described in detail later, the SiC crystal manufacturing apparatus 10 includes sensor fixing portions 18a-18d for measuring the second physical quantities when controlling the actuators 20 so that the temperature inside the chamber 12 is lower than the heat resistant temperature of sensors. The sensor fixing portion 18a is provided on the surface of the susceptor 13. The sensor fixing portion 18b is provided on an inner side surface of the chamber 12. The sensor fixing portion 18c is provided on an inner bottom surface of the chamber 12. The sensor fixing portion 18d is provided in a raw material gas supply path at the bottom of the chamber 12. By arranging sensors (sensors that measure the temperature and the pressure) on the sensor fixing portions 18a-18d and controlling the actuators 20 under conditions that do not exceed the heat resistant temperature of sensors, the second physical quantities (the temperature and the pressure) in various parts inside the chamber 12 can be measured. Sensors that measure the second physical quantities are collectively referred to as second sensors 19. Since the second sensors 19 cannot be attached when manufacturing the SiC crystal, the second sensors 19 are drawn by dotted lines in FIG. 1. The sensor fixing portions 18a-18d are examples, and the sensor fixing portions may be provided at other positions.

Figure 2:
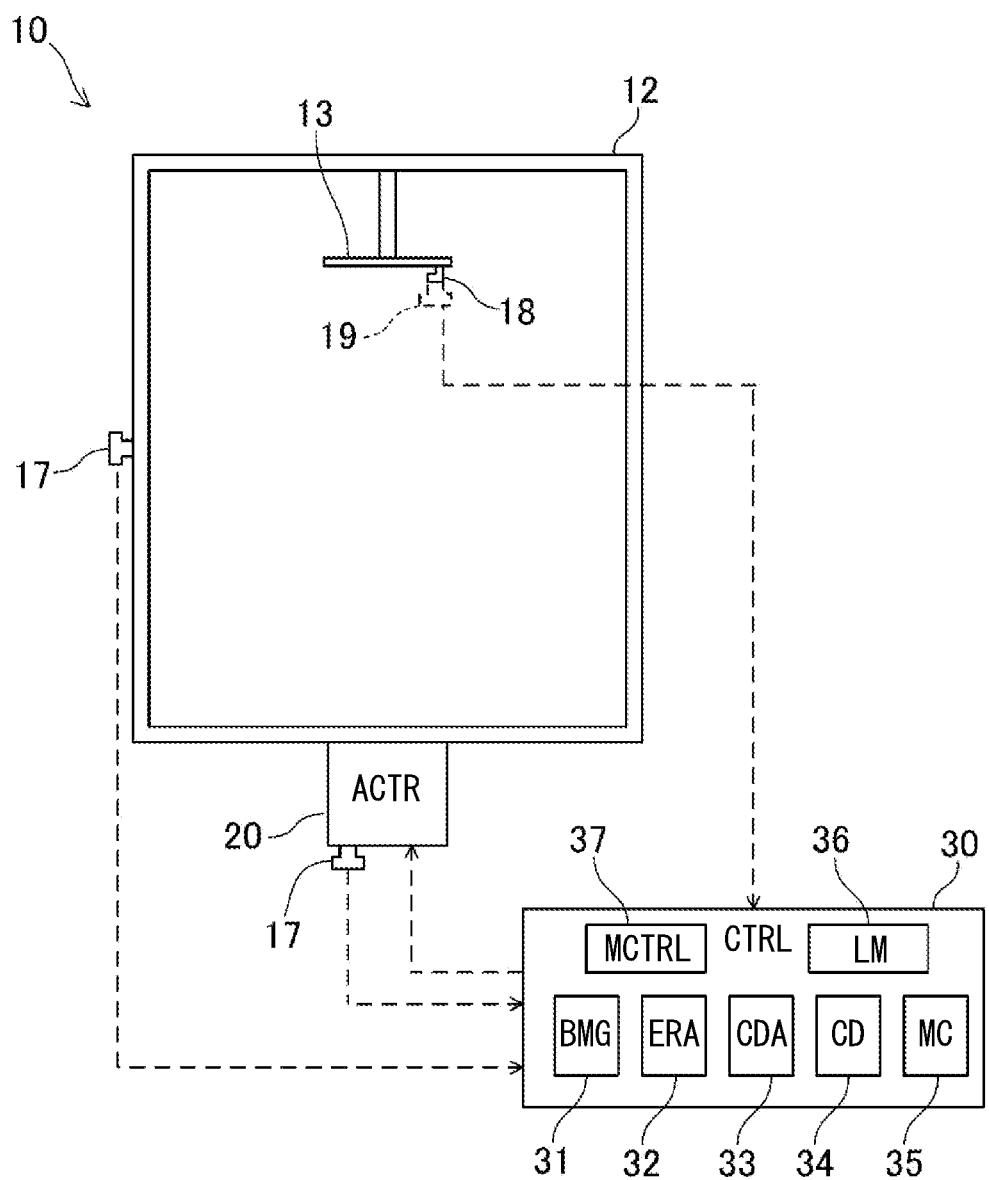
FIG. 2 is a schematic diagram of the SiC crystal manufacturing apparatus.

In order to make the explanation easier to understand, a schematic diagram of the SiC crystal manufacturing apparatus 10 is shown in FIG. 2. In FIG. 2, the multiple actuators (ACTR) 20 are drawn by one rectangle. The first sensors 17 are arranged outside the chamber 12, that is, at positions where the temperature does not exceed the heat resistant temperature of sensors when manufacturing the SiC crystal. Sensors that detect the outputs of the actuators 20 are also included in the first sensors 17.

The sensor fixing portions 18 are provided at positions (typically the surface of the susceptor 13) where the temperature exceeds the heat resistant temperature of sensors when manufacturing the SiC crystal. The second sensors 19 can be attached to the sensor fixing portion 18, respectively. However, the second sensors 19 are removed when manufacturing the SiC crystal, and are attached when the actuators 20 of the SiC crystal manufacturing apparatus 10 are controlled under the conditions that the temperature is lower than the heat resistant temperature of sensors. The sensor fixing portions 18 may have attaching portions for attaching the second sensors 19, respectively. The attaching portions include, for example, brackets, screw holes to be fastened to the second sensors 19, or engaging portions to be engaged with the second sensors 19.

The control device 30 in the SiC crystal manufacturing apparatus 10 can generate a learning model that outputs estimated values of the second physical quantities from the measured values of the first sensors 17 and the second sensors 19. The learning model can estimate the second physical quantities (typically, the surface temperature) at the time of manufacturing the SiC crystal with high accuracy. In the process of generating the learning model, measured values when the actuators 20 are controlled so that the inside of the chamber 12 is lower than the heat resistant temperature of sensors are used. Accordingly, highly accurate estimated values can be obtained.

The control device controls the actuators 20 to operate the SiC crystal manufacturing apparatus 10, and acquires the estimated values of the second physical quantities by using the measured values of the first sensors 17 and the learning model. The control device 30 controls the actuators 20 so that the differences between the target values and the estimated value of the second physical quantities become small. Since the learning model can output highly accurate estimate value, it is possible to manufacture high-quality single crystals.

The control device 30 will be described. The control device 30 includes a basic model generation module (BMG) 31, an experimental result acquisition module (ERA) 32, a correlation data acquisition module (CDA) 33, a correlation determination module (CD) 34, a model correction module (MC) 35, a learning model (LM) 36, and a main control module (MCTRL) 37. Each module will be described below.

The basic model generation module 31 generates a basic learning model that is the basis of the highly accurate learning model 36. Specifically, the basic model generation module 31 uses a simulation model generated based on structural data of the SiC crystal manufacturing apparatus 10 to generate multiple simulation results (first simulation results) of sets of the first physical quantities and the second physical quantities. Then, the basic model generation module 31 generates the basic learning model by machine learning using the first simulation results as teacher data. The structural data of the SiC crystal manufacturing apparatus 10 includes, typically, physical property values (thermal conductivity, rigidity, and the like) of materials constituting the SiC crystal manufacturing apparatus 10. The structural data also includes physical property values (viscosity, coefficient of thermal expansion, boiling point, melting point, and the like) of the raw material gas. The simulation model can be obtained analytically using, for example, a finite element method (FEM). Computational fluid dynamics (CFD) technique may also be used to simulate the row material gas. In FEM, the SiC crystal manufacturing apparatus 10 and an internal space of the SiC crystal manufacturing apparatus 10 are divided into a large number of mesh points, the characteristics of the structure (thermal conductivity, properties of the raw material gas, and the like) are given to each mesh point, and energy equations (heat conduction equation and fluid equation of motion) between adjacent mesh points are given. Numerical values corresponding to the operations of the respective actuators 20 are given to the mesh points corresponding to the respective actuators 20 and the above energy equations are solved to obtain changes with time in physical quantities (temperature, pressure, and the like) of the respective mesh points. The physical quantities of the mesh points corresponding to the installation positions of the first sensors 17 correspond to the first physical quantities, and the physical quantities of the mesh points corresponding to the installation positions of the second sensors 19 (sensor fixing portions 18) correspond to the second physical quantities. A typical example of the second physical quantities is the surface temperature of the susceptor 13.

The basic model generation module 31 simulates the state of the SiC crystal manufacturing apparatus 10 at the time of manufacturing the SiC crystal by using the above-described simulation model. In other words, the basic model generation module 31 simulates the state of the SiC crystal manufacturing apparatus 10 when the actuators 20 are controlled under the conditions of manufacturing the SiC crystal. The basic model generation module 31 acquires multiple sets of the first physical quantities and the second physical quantities at different times in the simulation as the first simulation results.

Figure 3:
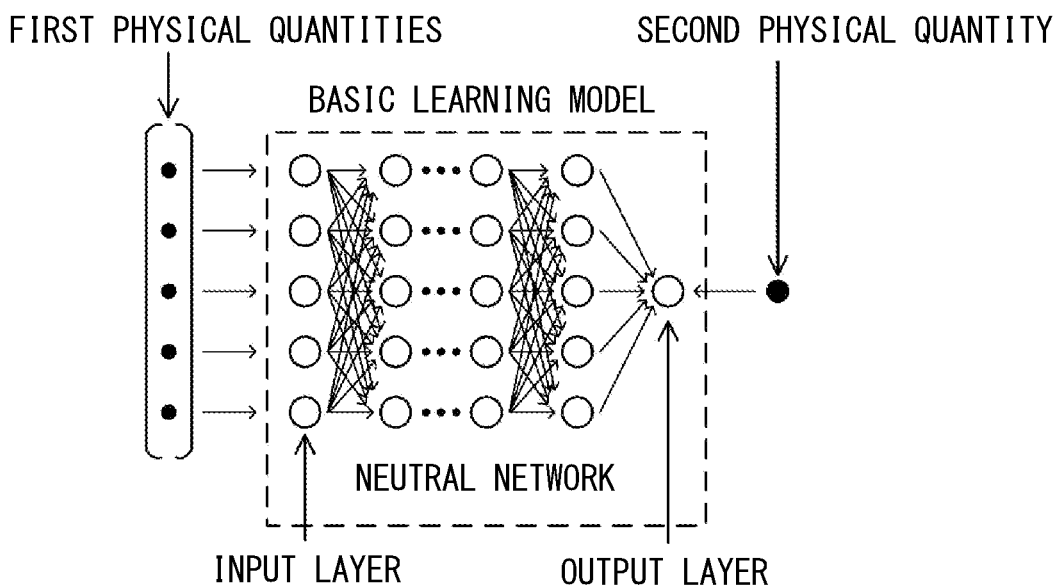
FIG. 3 is a schematic diagram for explaining a basic learning model.

The basic model generation module 31 executes a machine learning using the multiple first simulation results as teacher data, and generates a learning model of the SiC crystal manufacturing apparatus 10. For convenience of explanation, the learning model generated in this process is referred to as a basic learning model. One first simulation result (one set of the first physical quantities and the second physical quantities) corresponds to one teacher data. For the machine learning, for example, a neural network deep learning method is used. FIG. 3 shows a schematic diagram of the basic learning model. An input layer of the neural network has the same number of nodes as the number of the first physical quantities of the first simulation results. In the example of FIG. 3, an output layer of the neural network has one node. The weight of the neural network is learned so that the second physical quantity included in the first simulation result can be obtained from the output layer when the first physical quantities included in the first simulation results are input to the input layer. Accordingly, the basic learning model can be obtained. In this example, the value of the node in the output layer is the surface temperature of the susceptor 13.

If new first physical quantities are input to the obtained basic learning model, a new estimated value of the second physical quantity (the surface temperature of the susceptor 13) corresponding to the new first physical quantities can be obtained. However, in the basic learning model, it is difficult to reflect the accurate physical property values of each part of the SiC crystal manufacturing apparatus 10 and the influence of deterioration over time. That is, the output of the basic learning model cannot be expected to have high accuracy in consideration of deterioration over time. Therefore, in the SiC crystal manufacturing apparatus 10 disclosed in the present disclosure, a correlation between the behavior of the actual SiC crystal manufacturing apparatus 10 and a simulation result is specified, and the correlation is used to correct the output of the basic learning model.

The experimental result acquisition module 32 uses the SiC crystal manufacturing apparatus 10 to which the first sensors 17 and the second sensors 19 are attached, and the actuators 20 are driven under the conditions that the SiC crystal is unable to be manufactured while the second physical quantity is observable. The second sensors 19 shown by the broken lines in FIGS. 1 and 2 are actually attached to the SiC crystal manufacturing apparatus 10 to perform an experiment. The control device 30 drives the actuators 20 so that the temperature inside the chamber 12 does not exceed the heat resistant temperature of sensors. The experimental result acquisition module 32 acquires multiple experimental results of sets of the measured values of the first sensors 17 (first sensor measured values) and the measured values of the second sensors 19 (second sensor measured values) at that time. As described above, the second sensors 19 measure the second physical quantities. For convenience of explanation, in the following, an experiment performed by the experiment result acquisition module 32 to acquire data may be referred to as a preliminary experiment.

The correlation data acquisition module 33 acquires simulation results of the second physical quantities when the first physical quantities match the first sensor measured values by using the simulation model. The simulation model is a model used by the basic model generation module 31. The correlation data acquisition module 33 uses the simulation model, executes the simulation under the same conditions as the preliminary experiment, and obtains the simulation results of the second physical quantities as outputs. The simulation outputs when the first physical quantities match the first sensor measured values are referred to as second simulation results.

Figure 4:
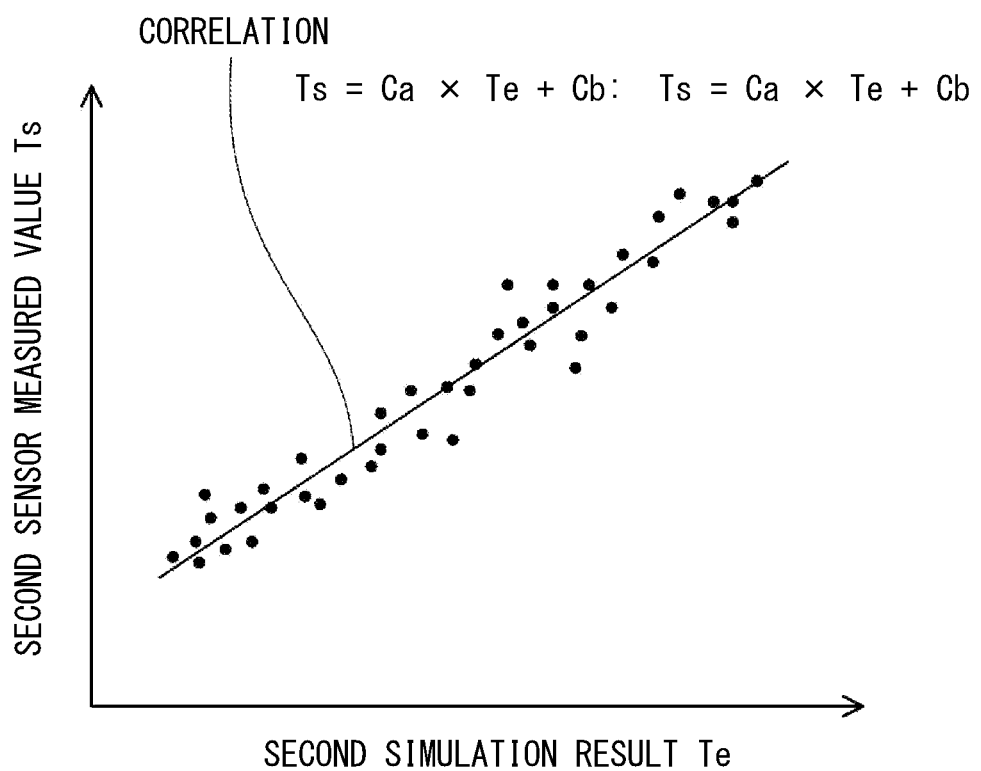
FIG. 4 is a graph showing a relationship between second simulation results and second sensor measured values.

The correlation determination module 34 determines a correlation between the second simulation results obtained by the correlation data acquisition module 33 and the second sensor measured values obtained by the second sensors 19 in the preliminary experiment. For convenience of explanation, the second simulation results are represented by the symbol Te, and the experimental results (the second sensor measured values) are represented by the symbol Ts. FIG. 4 shows an example of a graph in which multiple sets of the second simulation results Te and the second sensor measured values Ts are plotted. In FIG. 4, the horizontal axis represents the second simulation results Te, and the vertical axis represents the second sensor measured values Ts.

When the correlation is obtained by the linear regression method from the sets of the second simulation results Te and the second sensor measured values Ts, a regression line of [the second sensor measured value Ts]=Ca×[the second simulation result Te]+Cb is obtained. Here, Ca represents the slope of the regression line, and Cb represents the intercept of the regression line. FIG. 4 is merely an example, and the correlation between the second simulation results Te and the second sensor measured value Ts may be represented by a polynomial or a nonlinear function.

The second sensor measured values as the results of the preliminary experiment reflect the characteristics of the actual SiC crystal manufacturing apparatus 10 such as the physical properties of the structure and material of the chamber 12 and after deterioration over time. The second simulation results are the data obtained from the simulation model, and does not reflect all the characteristics of the actual SiC crystal manufacturing apparatus 10. The correlation from the second simulation results to the second sensor measured values is useful for correcting the results of the simulation model based on the accurate physical property values of the structure of the SiC crystal manufacturing apparatus 10.

Figure 5:
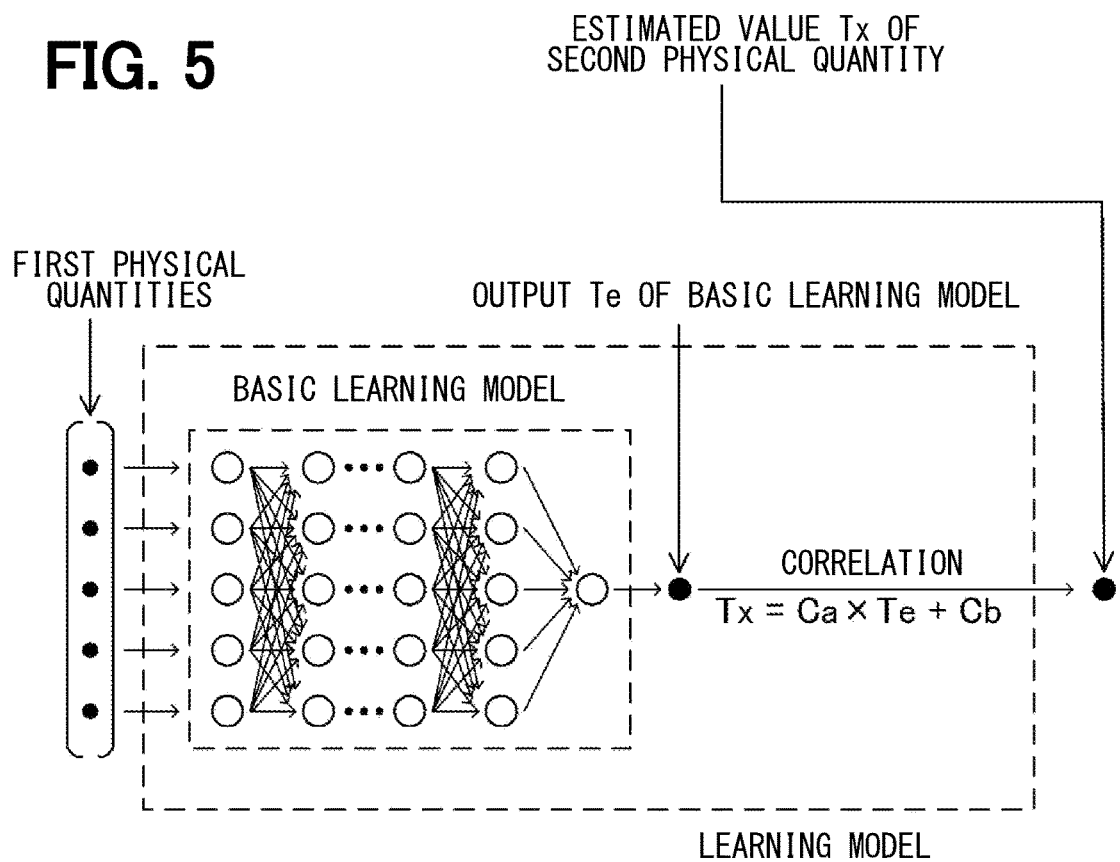
FIG. 5 is a schematic diagram for explaining a structure of a learning model.

The model correction module 35 generates the learning model 36 that outputs the result of correcting the output of the basic learning model by the correlation determined by the correlation determination module 34 as an estimated value (estimated value of the second physical quantity). FIG. 5 shows an explanatory diagram of the learning model 36 that is finally obtained. The learning model 36 is composed of the basic learning model and the correlation with respect to the output of the basic learning model, that is, the correlation formula obtained by the correlation determination module 34. When new first physical quantities that are adjusted so as to manufacture the SiC crystal are input to the basic learning model, an output (second simulation result Te) is obtained. The second simulation result Te is an estimation of the second physical quantity during crystal production (for example, the temperature at the surface 13a of the susceptor 13) by the basic learning model. The learning model 36 corrects the output of the basic learning model (the second simulation result Te) by the correlation formula (a final estimated value Tx=Ca×Te+Cb). The learning model 36 outputs the estimated value Tx corrected with the correlation formula.

As described above, the learning model 36 reflects the result of the preliminary experiment using the actual SiC crystal manufacturing apparatus 10. That is, the learning model 36 reflects the accurate physical property values of each part of the SiC crystal manufacturing apparatus 10 and the influence of deterioration over time.

The advantages of the SiC crystal manufacturing apparatus 10 of the present embodiment (particularly, the advantages of the generation technique of the learning model 36) will be described. In general, a huge amount of teacher data is required to generate a learning model by machine learning. In the SiC crystal manufacturing apparatus 10, the teacher data is obtained by the simulation using an analytical simulation model of the SiC crystal manufacturing apparatus 10. Since the simulation is performed using a computer, a large amount of teacher data can be automatically obtained by batch processing or the like.

When a learning model is generated using experimental results as teacher data, many experiments must be performed in order to obtain a large number of teacher data, which increase an economical cost and a temporal cost. The SiC crystal manufacturing apparatus 10 disclosed in the present disclosure uses the simulation results for generating the basic learning model, and the results of preliminary experiments are used for fine tuning of the basic learning model. Since the experimental results are only used for fine tuning, the number of samples may be smaller than when the teacher data for the learning model is generated. The SiC crystal manufacturing apparatus 10 of the present embodiment can generate the learning model 36 capable of accurately predicting the state in the furnace in a shorter time than the conventional technique.

The SiC crystal manufacturing apparatus 10 also uses the first sensors 17 used in crystal manufacturing to obtain data for correcting the output of the basic learning model (experimental results acquired by the experimental result acquisition module 32). Since the first sensors 17, which are used when actually manufacturing crystals, are also used when acquiring the data for correction, the above-described correlation has high accuracy.

The basic model generation module 31, the experimental result acquisition module 32, the correlation data acquisition module 33, the correlation determination module 34, and the model correction module 35 can realize to obtain a highly accurate learning model that obtains the estimated value of the second physical quantity from the first physical quantities and that reflects the characteristics of the actual SiC crystal manufacturing apparatus 10.

Figure 6:
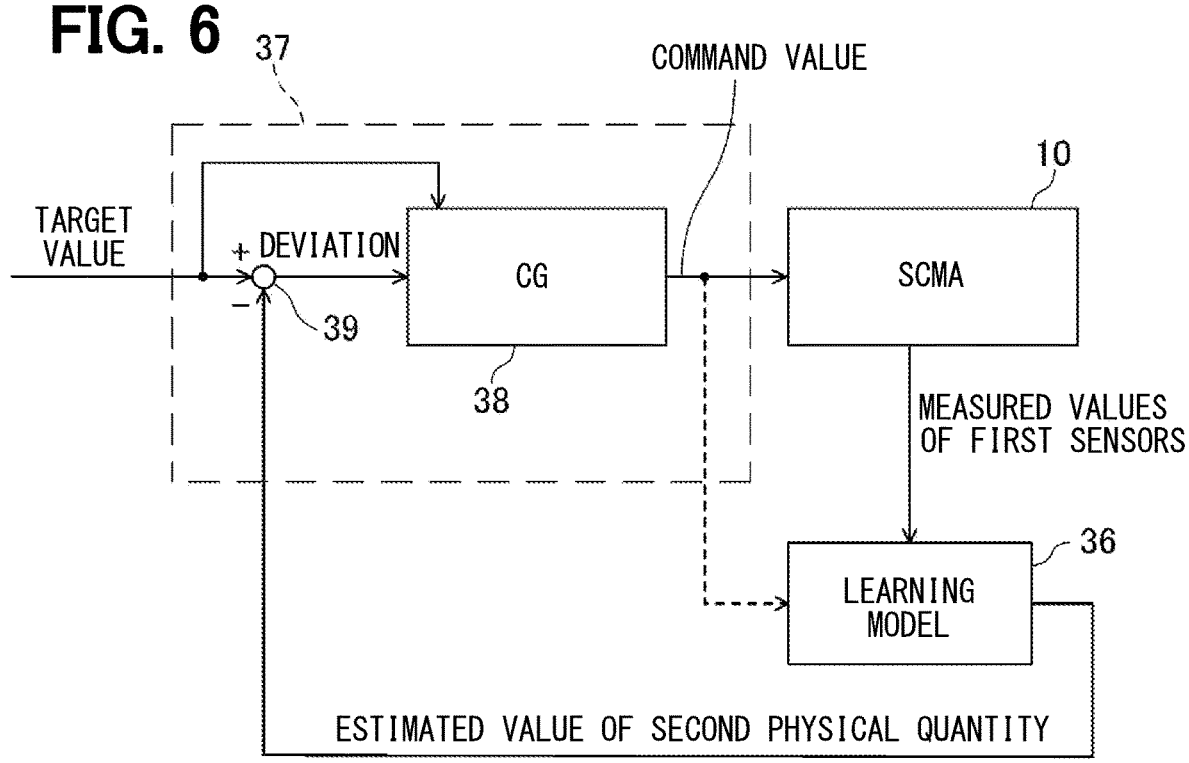
FIG. 6 is a block diagram of a main control module.

The main control module 37 feedback-controls the actuators 20 based on the measured values of the first sensors 17 when actually manufacturing the SiC crystal. FIG. 6 shows a block diagram of the main control module 37. In FIG. 6, the SiC crystal manufacturing apparatus (SCMA) 10 is simplified and drawn with one rectangle.

The main control module 37 includes a command generation unit (CG) 38 and a difference device 39. The main control module 37 controls the actuators 20 of the SiC crystal manufacturing apparatus 10 so that the second physical quantity (for example, the surface temperature of the susceptor 13) follows the predetermined target value. As described above, the target value is preset to an optimum value for the growth of SiC crystals.

The command generation unit 38 generates command values to the actuators 20 based on the target value of the second physical quantity. The block of FIG. 6 does not operate until the temperature inside the chamber 12 reaches a predetermined initial temperature, and the actuators 20 are controlled in a predetermined sequence. When the temperature inside the chamber 12 reaches the initial temperature, the block of FIG. 6 functions and the actuators 20 are controlled so that the second physical quantity follows the target value.

The SiC crystal manufacturing apparatus 10 includes the first sensors 17, and the measured values of the first sensors 17 are input to the learning model 36. The learning model 36 outputs the estimated value of the second physical quantity corresponding to the measured values of the first sensors 17.

The target value is directly input to the command generation unit 38, and the difference between the target value and the estimated value is input. The difference between the target value and the estimated value is generated by the difference device 39. The command generation unit 38 implements a control rule that combines feedforward and feedback. The command generation unit 38 applies a first control rule to the target value and generates a feedforward command. At the same time, the command generation unit 38 applies a second control rule to the difference between the target value and the estimated value, and generates a feedback command. The final command is the sum of the feedforward command and the feedback command. The first control rule and the second control rule may be well-known control rules such as PID (proportional-integral-differential) control rule, PI (proportional-integral) control rule, PD (proportional-differential) control rule, and the like.

The command generation unit 38 gives the generated command to the actuators 20 and drives the SiC crystal manufacturing apparatus 10 by feedback control. When the actuators 20 operate according to the command values, the measured values of the first sensors 17 change. Since the measured values of the first sensors 17 are input to the learning model 36, the estimated value of the second physical quantity output by the learning model 36 also changes. Although the difference between the target value and the estimated value changes, the main control module 37 controls the actuators 20 of the SiC crystal manufacturing apparatus 10 so that the difference between the target value and the estimated value becomes small. The time required for receiving the measured values from the sensors and controlling the actuators is about the time required for input and output of the mechanical model (a few milliseconds to 1 second).

As described above, the first physical quantities may include the outputs of the actuators 20. The command values to the actuators 20 correspond to approximate values of the outputs of the actuators 20. Therefore, when the outputs of the actuators 20 are included in the first physical quantities, the command values to the actuators 20 may be input to the learning model 36 as a part of the first physical quantities. The dotted arrow line in FIG. 6 represents the case where the command values to the actuators 20 are input to the learning model 36.

In summary, the main control module 37 performs the following process. The main control module 37 utilizes the learning model 36. The learning model 36 outputs the estimated value of the second physical quantity, which is unobservable under the conditions of manufacturing the SiC crystal, from the measured values of the first sensors 17. The main control module 37 controls the actuators 20 so that the difference between the estimated value output by the learning model 36 and the target value of the second physical quantity becomes small when manufacturing the SiC crystal. Since the second physical quantity that deeply affects crystal growth can be brought close to the target value, the SiC crystal can be manufactured with high quality.

The advantages of the control device 30 including the learning model 36 will be described. The learning model 36 is composed of the basic learning model by machine learning and the correlation. The basic learning model is the model based on machine learning, and since it is not necessary to solve complicated equations, results can be obtained at high speed. The correlation is a relational expression expressing the relationship between the experimental results (measured values) and the corresponding simulation outputs (second simulation results). The correlation is expressed by a regression line or a relational expression such as an approximate polynomial, and high-speed calculation is possible. That is, when the learning model 36 is used, the estimated value of the second physical quantity can be obtained at high speed.

Further, the output of the basic learning model is corrected by the correlation based on the result of the preliminary experiment using the actual SiC crystal manufacturing apparatus 10. The correction increases the accuracy of the estimated value. By using the learning model 36, it is possible to obtain an accurate estimated value of the second physical quantity, which is unobservable at the time of manufacturing crystals, at high speed. Therefore, the control device 30 using the learning model 36 is suitable for feedback control. When the control device 30 that executes feedback control using the learning model 36 controls the actuators 20 of the SiC crystal manufacturing apparatus 10, the SiC crystal can be manufactured with high quality.

The output of the learning model 36 is the estimated value of the second physical quantity, not the measured value. The feedback control using the estimated value instead of measured values may be referred to as pseudo-feedback control.

The control device 30 of the present embodiment is effective by itself. That is, the present discloses provides a novel SiC crystal manufacturing apparatus 10 and a novel control device 30 for controlling a SiC crystal manufacturing apparatus.

Second Embodiment

Figure 7:
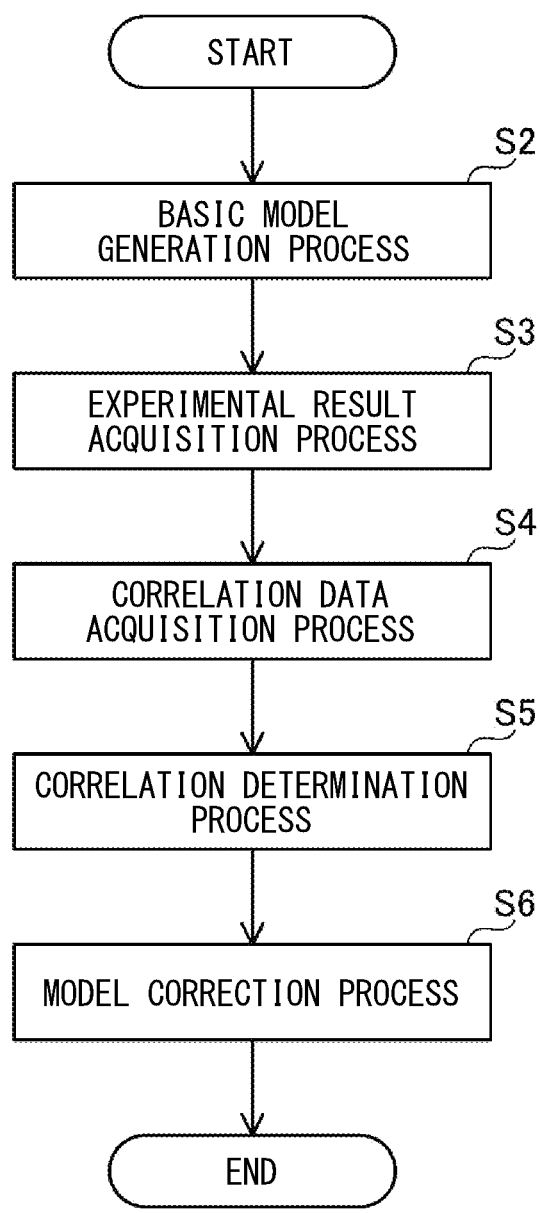
FIG. 7 is a flowchart of a learning model generation method.

The present disclosure also provides a method for generating a learning model suitable for controlling a SiC crystal manufacturing apparatus. This method generates a learning model that obtains an estimate value of an unobservable second physical quantity from observable first physical quantities when manufacturing a SiC crystal with a SiC crystal manufacturing apparatus. FIG. 7 shows a flowchart of a learning model generation method. This method includes a basic model generation process (S2), an experimental result acquisition process (S3), a correlation data acquisition process (S4), a correlation determination process (S5), and a model correction process (S6).

The basic model generation process (S2) includes generating a basic learning model by machine learning using, as teacher data, multiple simulation results (first simulation results) of sets of the first physical quantities and the second physical quantity generated using a simulation model based on structural data of the SiC crystal manufacturing apparatus. The details of the basic model generation process are similar to the process of the basic model generation module 31 described above.

The experimental result acquisition process (S3) includes using the SiC crystal manufacturing apparatus attached with first sensors for measuring first physical quantities and a second sensor for measuring the second physical quantity, and driving actuators of the SiC crystal manufacturing apparatus under conditions that the SiC crystal is unable to be manufactured while the second physical quantity is observable. This experiment is called a preliminary experiment. The experimental result acquisition process includes acquiring multiple experimental results of sets of measured values of the first sensors (first sensor measured values) and a measured value of the second sensor (second sensor measured value) in the preliminary experiment. The details of the experiment result acquisition process are similar to the process of the experiment result acquisition module 32 described above.

The correlation data acquisition process (S4) includes acquiring simulation results of the second physical quantity (second simulation results) when the first physical quantities match the first sensor measured values by using the simulation model. The details of the correlation data acquisition process are similar to the process of the correlation data acquisition module 33 described above. The correlation determination process (S5) includes determining a correlation between the second simulation results and the second sensor measured values. The details of the correlation determination process are similar to the process of the correlation determination module 34 described above.

The model correction process (S6) includes generating the learning model 36 that outputs a result of correcting an output of the basic learning model with the above-described correlation as an estimated value. The details of the model correction process are similar to the processes of the model correction module 35 described above.

The present disclosure also provides a control method using the learning model 36 obtained by the above-described generation method. In the control method, first, the measured values of the first sensors 17 are acquired from the SiC crystal manufacturing apparatus 10 operating under the conditions of manufacturing the SiC crystal. Next, the measured values of the first sensors are input to the learning model to acquire the estimated value of the second physical quantity. Then, the SiC crystal manufacturing apparatus is controlled so that the difference between the target value and the estimated value of the second physical quantity becomes small. According to this control method, the SiC crystal can be manufactured with high quality.

Next, a typical example of the learning model generation method will be described. The generation method described below is an example, and techniques disclosed in the present disclosure are not limited to the following examples.

The learning model outputs the estimated value of the second physical quantity at a predetermined position at which temperature exceeds the heat resistant temperature of sensors, from the first physical quantities that are observable when manufacturing the SiC crystal by the SiC crystal manufacturing apparatus. The method includes a basic model generation process, an experimental result acquisition process, a correlation data acquisition process, a correlation determination process, and a model correction process. Hereinafter, for convenience of explanation, the predetermined position at which temperature exceeds the heat resistant temperature of sensors when manufacturing SiC crystal is referred to as a position of interest. The typical position of interest is the surface of the susceptor, and the typical second physical quantity is temperature (or pressure).

In the basic learning model generation process, a simulation is performed under conditions of manufacturing the SiC crystal using a simulation model based on structural data of the SiC crystal manufacturing apparatus, and multiple simulation results of sets of the first physical quantities and the second physical quantity, that is, multiple first simulation results are obtained. Next, a basic learning model is generated in which the multiple first simulation results are machine-learned as teacher data. The basic learning model outputs an estimated value of the second physical quantity when the first physical quantities are input.

In the experimental result acquisition process, an auxiliary sensor (corresponding to the second sensor 19 described above) for measuring the second physical quantity is attached to the position of interest, the SiC crystal manufacturing apparatus is operated under conditions that the temperature at the position of interest is lower than the heat resistant temperature of sensors, although SiC crystals cannot be manufactured. It is referred to as a preliminary experiment to operate the SiC crystal manufacturing apparatus under the conditions that the temperature at the position of interest is lower than the heat resistant temperature of sensors, although the SiC crystal cannot be manufactured.

In the correlation data acquisition process, the simulation is performed using the simulation model under the same conditions as the preliminary experiment, and second simulation results corresponding to the measured values of the auxiliary sensors obtained in the preliminary experiment are obtained. The second simulation results correspond to the estimated values of the second physical quantity at the position of interest (estimated values before the correction described later). In the correlation determination process, a correlation between the second simulation results and the second sensor measured values is determined. An example of this correlation is the regression line described above. In the model correction process, a learning model is generated. In the learning model, the first physical quantities obtained when the SiC crystal manufacturing apparatus is operated under the conditions for manufacturing the SiC crystal are input to the basic learning model, and a result of correcting the output of the basic learning model with the above-described correlation is output as the estimated value of the second physical quantity.

The first physical quantities include temperatures (or pressures) of multiple positions of the SiC crystal manufacturing apparatus. In the preliminary experiment, the SiC crystal manufacturing apparatus is controlled so that the temperatures (or pressures) of the multiple positions are different. By performing the preliminary experiment as described above, the structural characteristics between various parts of the SiC crystal manufacturing apparatus and the position of interest are well reflected.

For convenience, the temperature at the position of interest described above is hereinafter referred to as the temperature of interest. The relationship between the temperature at each position and the temperature of interest depends on the structure of the SiC crystal manufacturing apparatus 10, and has substantially the same relationship regardless of whether the temperature of interest is high or low. Therefore, in the generation method of the above embodiment, the temperature at each position and the temperature of interest are measured in the SiC crystal manufacturing apparatus 10 operated so as not to exceed the heat resistant temperature of sensors by the preliminary experiment. In addition, the temperature of interest when the simulation is performed under the same conditions as the preliminary experiment is obtained. The relationship (correlation described above) between the temperature of interest obtained in the preliminary experiment (second sensor measured value) and the temperature of interest obtained by the simulation (second simulation result) is generally established regardless of the absolute value of the temperature. The correlation between the simulation results and the preliminary experiment results when the temperature is low holds even when the temperature is high. By using such a correlation, it becomes possible to accurately estimate the temperature at the position of interest that exceeds the heat resistant temperature of sensors when manufacturing crystals.

Here are some points to keep in mind regarding the techniques described so far. The learning models, that is, the basic learning model and the learning model 36 in the above-described embodiments are a multi-input single-output models. The techniques disclosed in the present disclosure can also use multi-input multi-output learning models. That is, the number of second physical quantities may also be two or more. Further, in the techniques disclosed in the present disclosure, a learning model in which the number of nodes in each layer is different (neural network type learning model) or another learning algorithm (for example, Gaussian process regression) may be adopted.

In the techniques disclosed in the present disclosure, the basic learning model is generated using the teacher data obtained by the simulation. All the teacher data for obtaining the basic learning model is obtained by simulation. Accordingly, a large number of teacher data can be obtained in a relatively short time. On the other hand, the correlation between the results of the experiment using the actual SiC crystal manufacturing apparatus and the simulation results corresponding to the experiment is determined. Since the experiment to obtain the measured values of the sensors is to obtain the correlation between the simulation results and the experimental results (the results reflecting the state of the actual SiC crystal manufacturing apparatus), the amount of data of the experimental results may be smaller than the teacher data for obtaining the learning model.

The second physical quantity means a physical quantity that is unobservable under the condition of manufacturing the SiC crystal. Here, "unobservable under the condition of manufacturing the SiC crystal" includes a case where it is practically inappropriate to spend a large amount of cost even if it is possible to observe it if a large amount of cost is applied.

After the SiC crystal manufacturing apparatus 10 is operated for a long period of time after the learning model 36 is generated, the experiment result acquisition module 32, the correlation data acquisition module 33, the correlation determination module 34, and the model correction module 35 may be started again. The learning model 36 can be updated according to the latest state of the SiC crystal manufacturing apparatus 10.

The techniques disclosed in the present specification are not limited to the SiC crystal manufacturing apparatus 10 shown in FIG. 1, and can be applied to other crystal manufacturing apparatus (for example, a crystal manufacturing apparatus based on a sublimation method, a solution method, an HT-CVD method, or a CVD method).

Although specific examples of the present disclosure have been described in detail above, these are merely examples and do not limit the scope of claims. The techniques described in the present description include various modifications and modifications of the specific examples illustrated above. In addition, the technical elements described in the present description or the drawings exhibit technical usefulness alone or in various combinations, and are not limited to the combinations described in the present description at the time of filing. In addition, the techniques illustrated in the present specification or drawings can achieve multiple purposes at the same time, and achieving one of the purposes itself has technical usefulness.

What is claimed is:

1. A silicon carbide (SiC) crystal manufacturing apparatus comprising:

a chamber in which a SiC crystal is generated from raw materials;

an actuator configured to control a manufacturing condition for generating the SiC crystal;

a first sensor configured to measure a first physical quantity that is observable under a condition of manufacturing the SiC crystal in the chamber; and a control device having a learning model that outputs an estimated value of a second physical quantity from a measured value of the first sensor, the second physical quantity being unobservable under the condition of manufacturing the SiC crystal, the control device configured to feedback-control the actuator so that a difference between the estimated value output from the learning model and a target value of the second physical quantity becomes small when manufacturing the SiC crystal, wherein the control device includes a basic model generation module configured to generate a basic learning model by mechanical learning using a first simulation result as teacher data, the first simulation result being a plurality of simulation results of a set of the first physical quantity and the second physical quantity generated using a simulation model based on structural data of the SiC crystal manufacturing apparatus, an experimental result acquisition module configured to acquire a plurality of experimental results of a set of a first sensor measured value and a second sensor measured value, the first sensor measured value being the measured value of the first sensor and the second sensor measured value being a measured value of a second sensor configured to measure the second physical quantity in the SiC crystal manufacturing apparatus attached with the first sensor and the second sensor when the actuator is driven under a condition that the SiC crystal is unable to be manufactured while the second physical quantity is observable, a correlation data acquisition module configured to acquire a second simulation result that is a simulation result of the second physical quantity output from the simulation model when the first physical quantity matches the first sensor measured value, a correlation determination module configured to determine a correlation between the second simulation result and the second sensor measured value, and a model correction module configured to generate the learning model that outputs, as the estimated value, a result of correcting an output of the basic learning model with the correlation.

2. The SiC crystal manufacturing apparatus according to claim 1, wherein the condition of manufacturing the SiC crystal in the chamber includes a temperature inside the chamber exceeding a heat resistant temperature of the second sensor, the condition that the SiC crystal is unable to be manufactured while the second physical quantity is observable includes the temperature inside the chamber being lower than the heat resistant temperature of the second sensor, the first sensor is disposed at a position at which a temperature is lower than a heat resistant temperature of the first sensor even under the condition of manufacturing the SiC crystal in the chamber, and the second sensor is attached inside the chamber when the actuator is driven under the condition that the SiC crystal is unable to be manufactured while the second physical quantity is observable and the experimental result acquisition module acquires the plurality of experimental results.

3. The SiC crystal manufacturing apparatus according to claim 2, further comprising
a sensor fixing portion disposed inside the chamber and configured to be attached with the second sensor when the actuator is driven under the condition that the SiC crystal is unable to be manufactured while the second physical quantity is observable and the experimental result acquisition module acquires the plurality of experimental results.

4. The SiC crystal manufacturing apparatus according to claim 3, further comprising
a susceptor disposed inside the chamber and configured to support a substrate for growing the SiC crystal, wherein
the sensor fixing portion is disposed on a surface of the susceptor, and
the second physical quantity includes a surface temperature of the susceptor.

5. A control device for controlling a silicon carbide (SiC) crystal manufacturing apparatus that includes a chamber in which a SiC crystal is generated from raw materials, an actuator configured to control a manufacturing condition for generating the SiC crystal, and a first sensor configured to measure a first physical quantity that is observable under a condition of manufacturing the SiC crystal in the chamber, the control device comprising:
a main control module having a learning model that outputs an estimated value of a second physical quantity from a measured value of the first sensor, the second physical quantity being unobservable under the condition of manufacturing the SiC crystal, the main control module configured to feedback-control the actuator so that a difference between the estimated value output from the learning model and a target value of the second physical quantity becomes small when manufacturing the SiC crystal;
a basic model generation module configured to generate a basic learning model by mechanical learning using a first simulation result as teacher data, the first simulation result being a plurality of simulation results of a set of the first physical quantity and the second physical quantity generated using a simulation model based on structural data of the SiC crystal manufacturing apparatus;
an experimental result acquisition module configured to acquire a plurality of experimental results of a set of a first sensor measured value and a second sensor measured value, the first sensor measured value being the measured value of the first sensor and the second sensor measured value being a measured value of a second sensor configured to measure the second physical quantity in the SiC crystal manufacturing apparatus attached with the first sensor and the second sensor when the actuator is driven under a condition that the SiC crystal is unable to be manufactured while the second physical quantity is observable;
a correlation data acquisition module configured to acquire a second simulation result that is a simulation result of the second physical quantity output from the simulation model when the first physical quantity matches the first sensor measured value;
a correlation determination module configured to determine a correlation between the second simulation result and the second sensor measured value; and
a model correction module configured to generate the learning model that outputs, as the estimated value, a result of correcting an output of the basic learning model with the correlation.

6. The control device according to claim 5, wherein
the condition of manufacturing the SiC crystal in the chamber includes a temperature inside the chamber exceeding a heat resistant temperature of the second sensor,
the condition that the SiC crystal is unable to be manufactured while the second physical quantity is observable includes the temperature inside the chamber being lower than the heat resistant temperature of the second sensor,
the first sensor is disposed at a position at which a temperature is lower than a heat resistant temperature of the first sensor even under the condition of manufacturing the SiC crystal, and
the second sensor is attached inside the chamber when the experimental result acquisition module acquires the plurality of experimental results.

* * * * *